United States Patent
Hashiguchi

[19]
[11] Patent Number: 5,886,931
[45] Date of Patent: Mar. 23, 1999

[54] DATA DETERMINING CIRCUITRY AND DATA DETERMINING METHOD

[75] Inventor: Akihiko Hashiguchi, Kanagawa, Japan

[73] Assignee: Sony Corporation, Tokyo, Japan

[21] Appl. No.: 100,407

[22] Filed: Jun. 19, 1998

[30] Foreign Application Priority Data

Jun. 20, 1997 [JP] Japan .................................. 9-163695

[51] Int. Cl.⁶ .................................................... G11C 7/00
[52] U.S. Cl. ............................ 365/189.05; 365/189.09; 327/55; 327/57
[58] Field of Search ............................... 365/189.05, 196, 365/226, 189.01, 189.09; 327/51, 55, 57, 205, 206

[56] References Cited

U.S. PATENT DOCUMENTS

| | | | |
|---|---|---|---|
| 4,348,601 | 9/1982 | Kitamura | 327/57 |
| 4,845,675 | 7/1989 | Krenik et al. | 327/57 X |
| 5,063,304 | 11/1991 | Iyengar | 327/310 |
| 5,719,810 | 2/1998 | Lee et al. | 365/189.05 X |
| 5,793,680 | 8/1998 | Okajima | 365/189.05 |

Primary Examiner—Do Hyun Yoo
Attorney, Agent, or Firm—Hill & Simpson

[57] ABSTRACT

Feedback control is performed on the potential of a bit line in accordance with a change in the potential. Meanwhile, the data which has been previously read on the bit line is temporarily latched in a D-type flip-flop. A reference voltage Vref determined by a bias circuit is offset by using an offset circuit while referring to the level of the previously read data latched in the D-type flip-flop. In this manner, a bias voltage is obtained from currently read data, and based on the bias voltage, the potential of the bit line is controlled. Thus, high-speed data determining operation is achieved, which has been previously hampered when the currently read data is reversed with respect to the data read in the previous cycle.

6 Claims, 5 Drawing Sheets

DATA DETERMINING CIRCUITRY AND DATA DETERMINING METHOD

BACKGROUND OF THE INVENTION

1. Field of the Invention

The present invention generally relates to data determining circuitry and a data determining method for determining the level of a data line used in a semiconductor circuit system. More particularly, the invention relates to current-mode-sense-type data determining circuitry for determining the level of a data line by detecting a current flowing in a drive circuit for the data line. The invention is also concerned with a data determining method used for the above type of circuitry.

2. Description of the Related Art

As a method for transferring data in a large scale integrated circuit (LSI) a current-mode transfer method is known and is becoming popular, since current-to-voltage conversion and low-amplitude high-speed transfer are possible in this method. For example, in a semiconductor memory circuit system, the current mode transfer is employed in a sense amplifier. Advantageously, in the current mode sense type, precharging is not required during the reading operation.

FIG. 4 is a schematic diagram illustrating the concept of a current mode sense amplifier. In FIG. 4, a P-type MOSFET (hereinafter referred to as "the PMOS") Trp31 and an N-type MOSFET (hereinafter referred to as "the NMOS") Trn31 are connected in series to each other between a power supply VDD and one end of a bit line 31. More specifically, the source electrode of the PMOS Trp31 is connected to the power supply VDD, while the source electrode of the NMOS Trn31 is connected to one end of the bit line 31. The drain electrode of the PMOS Trp31 is connected to the drain electrode of the NMOS Trn31, thereby forming a node N31. A sense output is extracted from the node N31.

The PMOS Trp31 is configured to act as a diode in which the gate electrode and the drain electrode are connected. The PMOS Trp31 is equivalent to a resistor which is offset by an amount equal to a threshold. Further, a reference voltage Vref is applied to the gate electrode of the NMOS Trn31. A memory cell 32 is connected between the other end of the bit line 31 and a ground GND. The memory cell 32 has the function of determining whether or not a current is caused to flow to the GND according to the state of the data stored in the memory cell 32.

In the circuitry configured as described above, it is now assumed that the memory cell 32 causes a current I to flow to the GND. In this case, the potential VBL of the bit line 31 decreases, increasing the gate-source voltage Vgs of the NMOS Trn31. This elevates the current capacity of the NMOS Trn31, thereby decreasing the drain-source voltage Vds. Namely, the NMOS Trn31 acts as a negative resistor in which the required applied voltage is decreased by causing a current to flow.

In this manner, since the PMOS Trp31 serves as a resistor, while the NMOS Trn31 acts as a negative resistor, the following condition is satisfied.

$$Vds\ (Trp31) + Vds\ (Trn31) \approx constant$$

Accordingly, the potential of the bit line 31 remains almost unchanged regardless of the presence or the absence of the current I. The current-versus-output voltage characteristics of this circuitry are shown in FIG. 5. In this characteristic diagram, VN31 represents the potential of the node N31.

The above-described circuitry presents the following problem. It is difficult to maintain the potential of the bit line 31 at a constant level without a large transconductance gm of the NMOS Trn31. Consequently, the circuitry is configured in the following manner in order to maintain the potential of the bit line 31 at a constant level if the transconductance gm of the NMOS Trn31 is small. Such a circuitry configuration is shown in FIG. 6.

In FIG. 6, the same elements as those shown in FIG. 4 are designated with like reference numerals. The circuitry illustrated in FIG. 6 is similar to the counterpart shown in FIG. 4, except that a bias circuit 33 is newly inserted between the gate electrode of the NMOS Trn31 and the bit line 31. In this circuitry, the bias circuit 33 has a feedback bias mechanism that increases the potential of the output with a decreasing potential VBL of the bit line 31. A specific example of the bias circuit 33 is shown in FIG. 7.

In FIG. 7, the bias circuit 33 is formed of a PMOS Trp32, an NMOS Trn32, and an offset power supply 34. The PMOS Trp32 is connected at its source electrode to a power supply VDD and at its gate electrode to the bit line 31. The NMOS Trn32, which acts as a diode, is connected at its drain electrode to the drain electrode of the PMOS Trp32, at its source electrode to a ground GND, and at its gate electrode to the gate electrode of the NMOS Trn31. The offset power supply 34 is connected between the bit line 31 and a GND.

The operation of the foregoing circuitry is described with reference to the waveform diagram of FIG. 8. A decrease in the potential VBL of the bit line 31 causes a decrease in the potential of the gate electrode of the PMOS Trp32, thereby elevating the current capacity of the PMOS Trp32. This further increases the reference voltage Vref, which is applied to the gate electrode of the NMOS Trn31, and accordingly, the current capacity of the NMOS Trn31 is elevated, thereby limiting the decrease in the potential VBL of the bit line 31.

Conversely, an increase in the potential VBL of the bit line 31 causes an increase in the potential of the gate electrode of the PMOS Trp32, thereby lowering the current capacity of the PMOS Trp32. This decreases the reference voltage Vref, and accordingly, the current capacity of the NMOS Trn31 is lowered, thereby inhibiting a current from flowing into the bit line 31. As a consequence, an increase in the potential VBL of the bit line 31 is limited.

According to the above-described operation of the circuitry, the problem caused by a small transconductance gm of the NMOS Trn31 can be solved. Namely, a change in the potential VBL of the bit line 31 is maintained substantially at a constant level even if the transconductance gm of the NMOS Trn31 is small.

A description is now given of the data detecting operation performed by the above-described known current-mode sense amplifier. A current flowing in the PMOS Trp31 is indicated by Ip, a current flowing in the NMOS Trn31 is indicated by In, a current caused to flow by the memory cell 32 is represented by Imem, and a current caused to flow by the offset power supply 34 is represented by Iss.

If the current Ip is greater than the current In (Ip>In), the charge supplied by a current having an amount equal to (Ip−In) is stored in the node N31. The potential VN31 of the node N31 is changed according to the amount of the stored charge. Moreover, the charge supplied by a current having an amount In−(Imem−Iss) increases the potential VBL of the bit line 31. Because of the increased potential VBL and the influence of the bias circuit 33, the current In flowing in the NMOS Trn31 is reduced.

When the current In eventually becomes equal to the sum of the currents Imem and Iss, the potential VBL of the bit line 31 is determined. When the current Ip becomes equal to the current In, the charge supply is suspended, and then, the potential VN31 of the node N31 is determined. The current In flowing in the NMOS Trn31 depends on the current capacity of the NMOS Trn31. Accordingly, the reference voltage Vref, which is applied to the gate electrode of the NMOS Trn31, is a key factor.

This is explained more specifically in the case where the high (H) level is to be extracted from the node N31. The current In becomes equal to the sum of Imem and Iss (In=Imem+Iss) more easily with a lower current capacity of the NMOS Trn31. It is thus desirable that the gate potential (reference voltage) Vref of the NMOS Trn31 is lower. On the other hand, in the case where the low (L) level is to be extracted from the node N31, the current In becomes equal to the sum of Imem and Iss (In=Imem+Iss) more easily with a higher current capacity of the NMOS Trn31. It is thus desirable that the gate potential (reference voltage) Vref of the NMOS Trn31 is higher.

For example, if the memory cell 32 causes a current to flow, it is preferable that the potential VN31 of the node N31 drops rapidly. Then, the potential VBL of the bit line 31 is lowered, which is fed back to the gate electrode of the NMOS Trn31 by the bias circuit 33, thereby elevating the gate potential Vref of the NMOS Trn31. Obviously, the circuitry is operated faster if the potential is set higher than the gate potential Vref determined by the above feedback control.

In contrast, if the memory cell 32 prevents the flowing of a current, it is preferable that the potential VN31 of the node N31 increases rapidly. Then, the potential VBL of the bit line 31 is increased, which is fed back to the gate electrode of the NMOS Trn31 by the bias circuit 33, thereby reducing the gate potential Vref of the NMOS Trn31. Clearly, the circuitry is operated faster if the potential is set lower than the gate potential Vref determined by the above feedback control.

In the known data determining circuitry described above, however, a bias voltage is obtained by using the bias circuit 33 from the data which is currently read, and based on the bias voltage, the potential VBL of the bit line 31 is controlled. It is thus difficult to set the potential higher or lower than the gate potential Vref determined by the feedback control. Particularly, if the data which is currently read is reversed with respect to the data which is read in the previous cycle, i.e., if the current data is reversed data, the data determining operation is disadvantageously delayed.

SUMMARY OF THE INVENTION

Accordingly, in view of the above-described background, it is an object of the present invention to provide data determining circuitry and a data determining method in which the data determining operation can be performed at high speed.

In order to achieve the above object, according to one aspect of the present invention, there is provided data determining circuitry for determining a level of data by a current flowing in a data line of a semiconductor circuit system. The data determining circuitry has a feedback control circuit for controlling a potential of the data line in accordance with a change in the potential. A data latch circuit temporarily latches data previously read on the data line. An offset circuit performs an offset operation on the data line based on a level of the previously read data latched in the data latch circuit.

According to the foregoing data determining circuitry, the feedback control circuit controls the potential of the data line in such a manner that an increased potential of the data line is decreased, and a decreased potential of the data line is increased, thereby maintaining the potential of the data line substantially at a constant level. Meanwhile, the offset circuit performs an offset operation on the data line while referring to the level of the previously read data which is latched in the data latch circuit. This makes it possible to set the potential of the currently read data higher or lower than the potential determined by the feedback control.

In the above-described data determining circuitry, the data line may be connected to a memory cell.

According to another aspect of the present invention, there is provided a data determining method for determining a level of data by a current flowing in a data line of a semiconductor circuit system. In this method, a feedback control is performed on a potential of the data line in accordance with a change in the potential. Data previously read on the data line is temporarily latched. An offset operation is performed on the data line based on a level of the previously read data which is temporarily latched.

In the foregoing data determining method, feedback control is performed on the potential of the data line, which is then maintained substantially at a constant level. Meanwhile, the offset operation is performed on the data line while referring to the previously read data. It is thus possible to set the potential of the currently read data higher or lower than the potential determined by the feedback control.

In the above-described method, the data line may be connected to a memory cell.

DESCRIPTION OF THE PREFERRED EMBODIMENT

Figure 1:
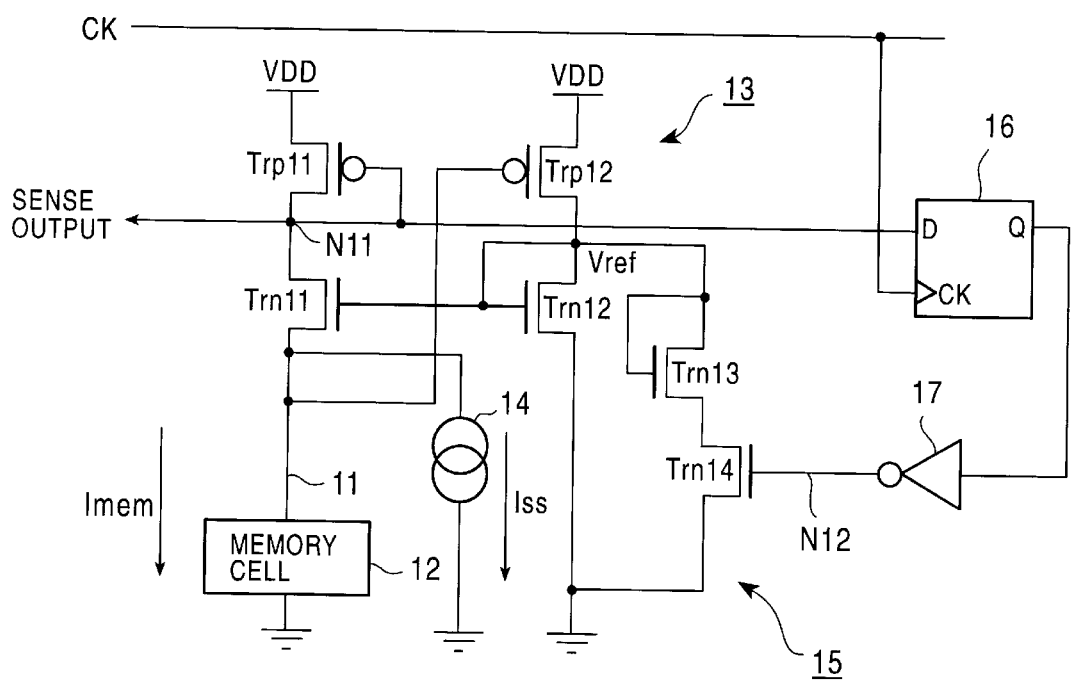
FIG. 1 is a circuit diagram illustrating an embodiment of the present invention.

An embodiment of the present invention is described in detail with reference to the drawings. FIG. 1 is a circuit diagram illustrating data determining circuitry for use in, for example, a sense amplifier of a semiconductor memory circuit system according to an embodiment of the present invention. In this embodiment, a data line corresponds to a bit line of a memory, and a drive circuit for the data line corresponds to a memory cell.

In FIG. 1, a PMOS Trp11, which serves as a current source transistor, and an NMOS Trn11, which serves as a control transistor, are connected in series to each other between a power supply VDD and one end of a bit line 11. More specifically, the source electrode of the PMOS Trp11 is connected to the power supply VDD, while the source electrode of the NMOS Trn11 is connected to one end of the bit line 11. The drain electrode of the PMOS Trp11 is connected to the drain electrode of the NMOS Trp11, thereby forming an output node N11. An output, which represents the level of the bit line 11, i.e., a sense output, is extracted from the node N11.

Figure 2:
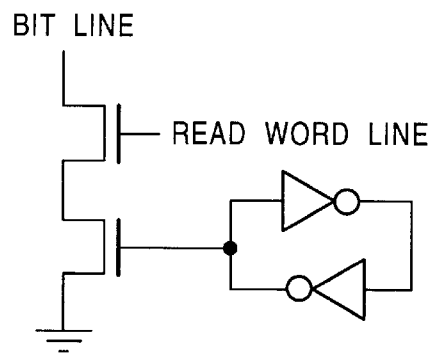
FIG. 2 is a circuit diagram illustrating an example of a memory cell.

A memory cell 12 is connected between the other end of the bit line 11 and a ground (GND). The memory cell 12 has the function of determining whether or not a current is caused to flow to the GND according to the state stored in the memory cell 12. An example of the configuration of the memory cell 12 is shown in FIG. 2. In the interests of simplicity, only the circuitry configuration related to the reading operation is shown.

A bias circuit 13 is formed of a PMOS Trp12, an NMOS Trn12, and an offset power supply 14. The PMOS Trp12 is connected at its source electrode to a power supply VDD and at its gate electrode to the bit line 11. The NMOS Trn12, which acts as a diode, is connected at its drain electrode to the drain electrode of the PMOS Trp12, at its source electrode to the ground GND, and at its gate electrode to the gate electrode of the NMOS Trn11. The offset power supply 14 is connected between the bit line 11 and the ground GND. The bias circuit 13 thus serves as a feedback control circuit that controls the potential of the bit line 11 in accordance with a change in the potential.

Newly added to the data determining circuitry are an offset circuit 15, a D-type flip-flop 16, and an inverter 17. The offset circuit 15 has an NMOS Trn13, serving as a diode, which is connected at its drain electrode to the drain electrodes of both the PMOS Trp12 and the NMOS Trn12, and an NMOS Trn14 connected between the source electrode of the NMOS Trn13 and the ground GND. The D-type flip-flop 16 receives as an input the potential of the node N11 as data (D), and the inverter 17 inverts the Q output of the D-type flip-flop 16 and supplies it to the gate electrode of the NMOS Trn14.

Figure 7:
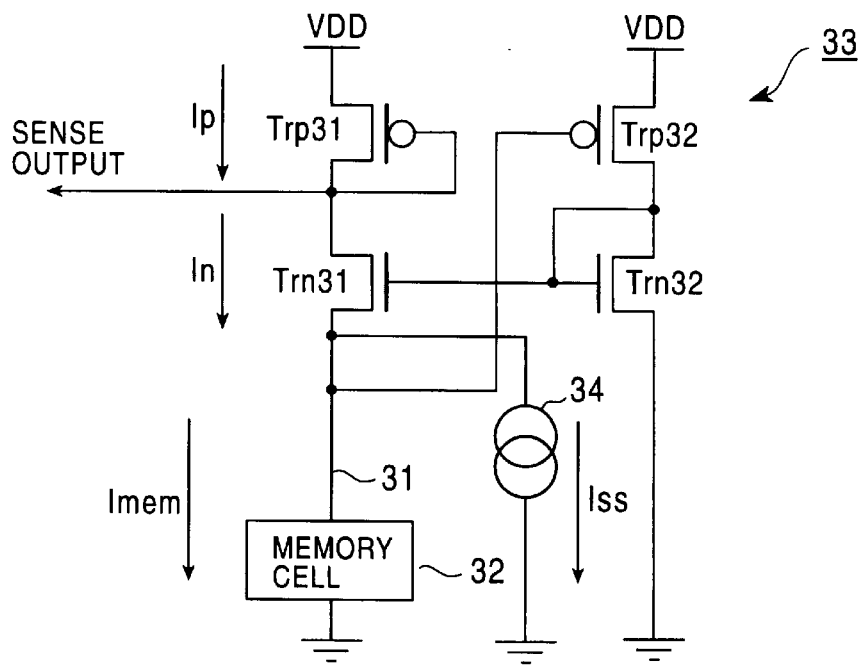
FIG. 7 is a circuit diagram illustrating a specific example of a bias circuit.
Figure 8:
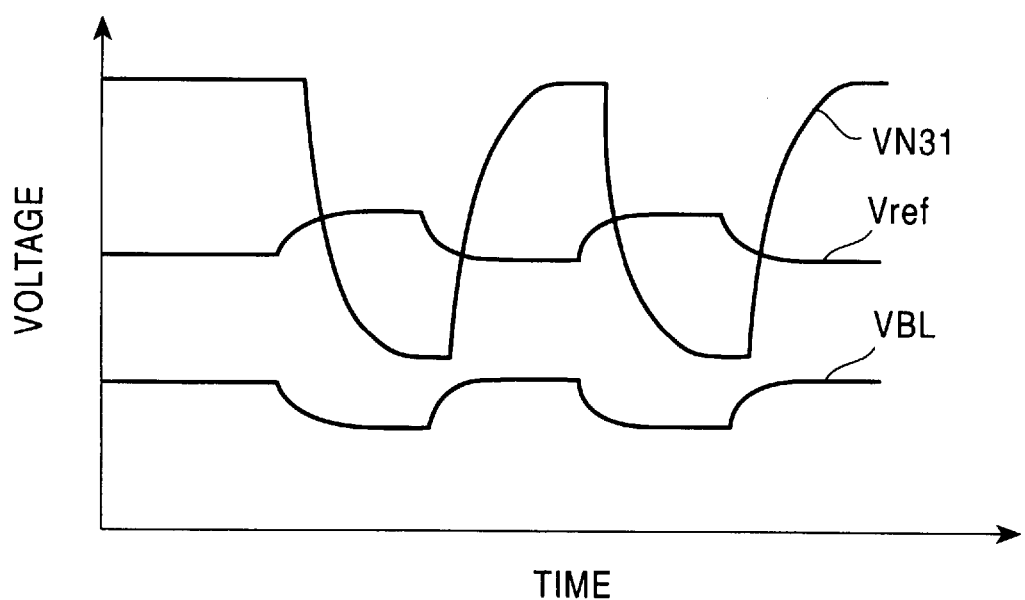
FIG. 8 is a waveform diagram illustrating the operation performed by known data determining circuitry.

As the NMOS Trn12, a transistor smaller than the NMOS Trn32 (FIG. 7) for use in known circuitry is used so that the NMOS Trn12 is able to increase the reference voltage Vref when the NMOS Trn14 of the offset circuit 15 is deactivated.

The D-type flip-flop 16 latches D-input data at the rising edge of a clock (CK) input, and produces the latched data Q as output. This makes it possible to preserve the previously read data as the Q output of the D-type flip-flop 16. Namely, the D-type flip-flop 16 serves as a data latch circuit for temporarily latching the previously read data.

In the offset circuit 15 formed of the NMOS Trn13 and the NMOS Trn14, the NMOS Trn14 is activated or deactivated according to the potential of the node N12, which is the output terminal of the inverter 17, i.e., according to the inverted Q output of the D-type flip-flop 16, thereby controlling the potential Vref of the gate electrode of the NMOS Trn11. Namely, the reference voltage Vref determined by the bias circuit 13 is offset to decrease when the NMOS Trn14 is activated. Conversely, the reference voltage Vref is offset to increase when the NMOS Trn14 is deactivated.

Figure 3:
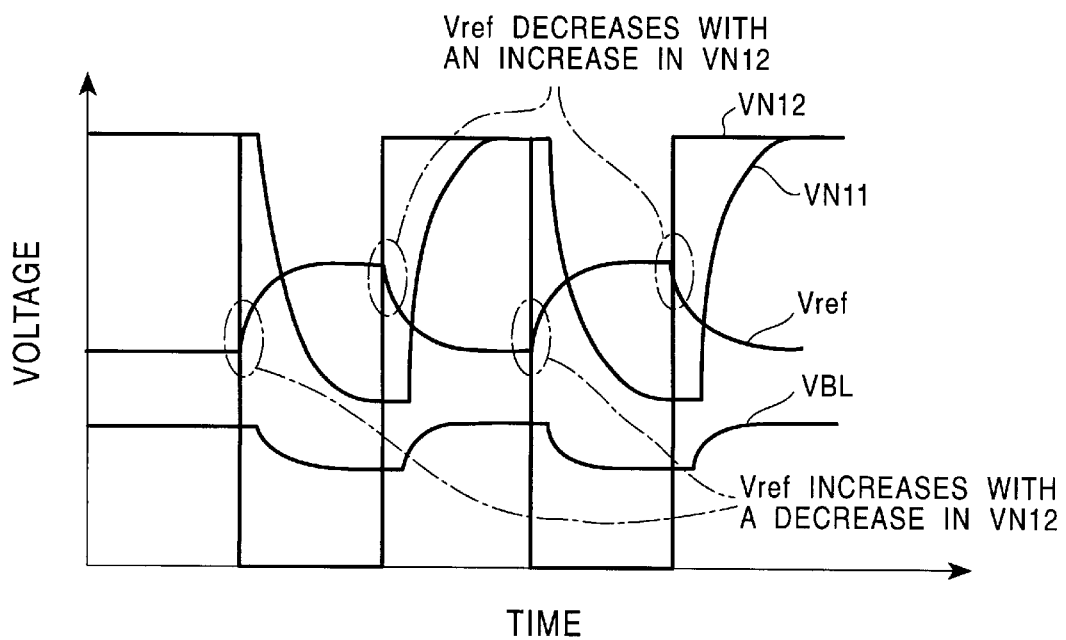
FIG. 3 is a waveform diagram illustrating the operation of the present invention.
Figure 4:
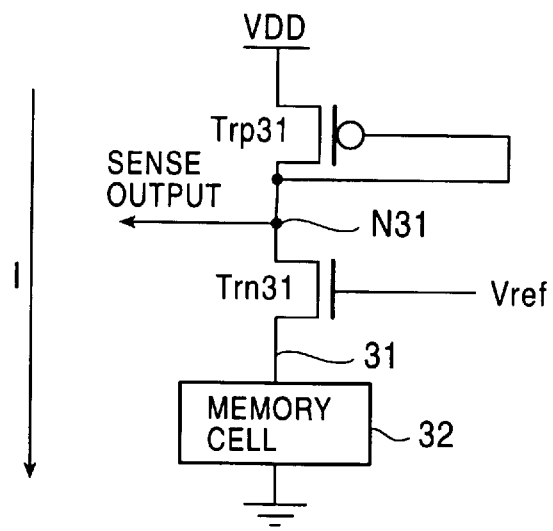
FIG. 4 is a schematic diagram illustrating the concept of a current mode sense amplifier.
Figure 5:
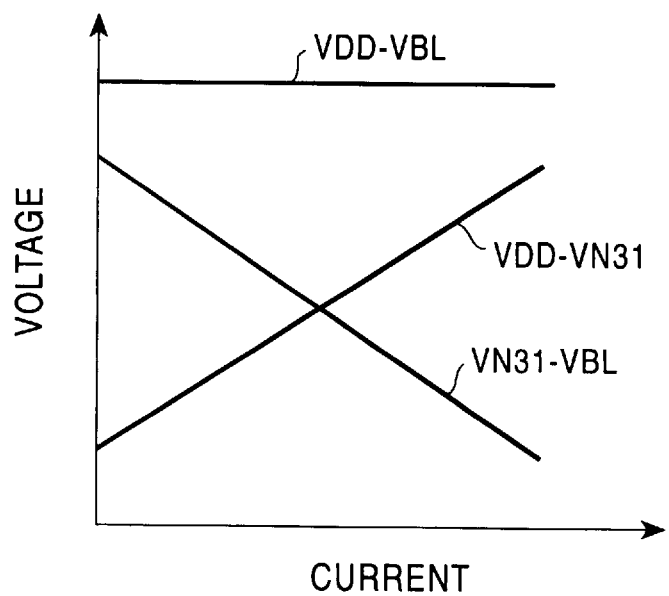
FIG. 5 illustrates current-versus-output voltage characteristics of the current mode sense amplifier.
Figure 6:
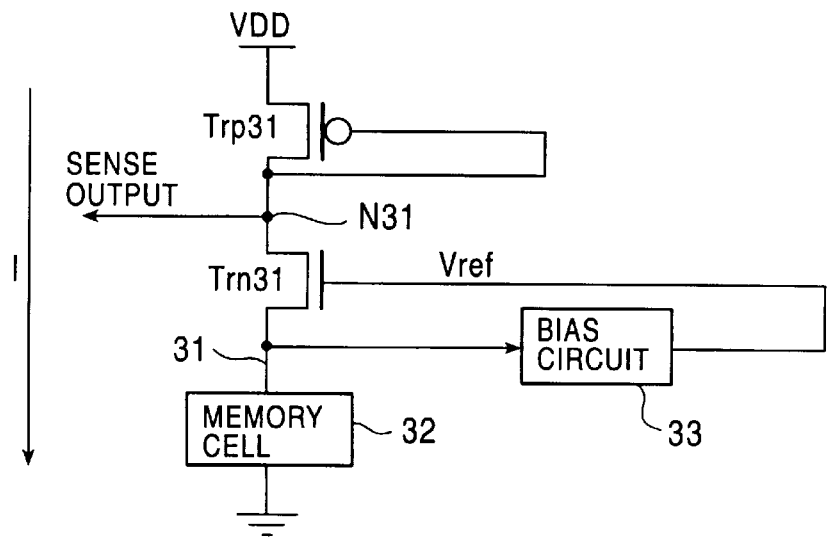
FIG. 6 is a circuit diagram of known data determining circuitry.

The operation of the sense amplifier configured as described above is now described with reference to the waveform diagram of FIG. 3. The current flowing in the PMOS Trp11 is indicated by Ip, the current flowing in the NMOS Trn11 is indicated by In, the current caused to flow by the memory cell 12 is represented by Imem, and the current caused to flow by the offset current supply 14 is represented by Iss.

The memory cell 12 causes the current Imem to flow, decreasing the potential VBL of the bit line 11 and further reducing the potential of the gate electrode of the PMOS Trp12. Accordingly, the current capacity of the PMOS Trp12 is elevated. Then, the reference voltage Vref, which is used as the gate potential of the NMOS Trn11, increases. At the same time, the current capacity of the NMOS Trn11 is elevated. As a result, a further decrease in the potential VBL of the bit line 11 is prevented, and the potential VN11 of the node V11 is reduced.

If data reversed with respect to the previously read data (reversed data) is to be read in the subsequent cycle, the Q output of the D-type flip-flop 16 changes so as to set the potential VN12 of the node N12 at the high H level, thereby activating the NMOS Trn14. Consequently, the reference voltage Vref is reduced to a level lower than the potential set by the bias circuit 13. This lowers the current capacity of the NMOS Trn11.

In this state since the memory cell 12 is preventing the flowing of the current Imem, i.e., the memory cell 12 is outputting reversed data, the potential VBL of the bit line 11 increases by the current In flowing in the NMOS Trn11. However, the lower reference voltage Vref inhibits an increase in the potential VBL of the bit line 11 over the foregoing conventional circuitry. Moreover, due to the lower reference voltage Vref, the current capacity of the NMOS Trn11 is low, and in combination with an increase in the potential VBL of the bit line 11, a current difference Ip–In is increased, thereby effecting an increase in the potential VN11 of the node N11.

It is now assumed that data reverse with respect to the previously read data is read in the subsequent cycle. The Q output of the D-type flip-flop 16 changes so as to set the potential VN12 of the node N12 at the low L level, thereby causing the NMOS Trn14 to be deactivated. Consequently, the potential is increased to a level higher than the reference voltage Vref set by the bias circuit 13. This elevates the current capacity of the NMOS Trn11.

In this state, since the memory cell 12 is causing the current Imem to flow, i.e., the memory cell 12 is outputting the reverse data with respect to the previously read data, the potential VBL of the bit line 11 is reduced. However, the higher reference voltage Vref inhibits a decrease in the potential VBL of the bit line 11 over the conventional circuitry. Moreover, due to the higher reference voltage Vref, the current capacity of the NMOS Trn11 is elevated, and in combination with a reduction in the potential VBL of the bit line 11, a current difference Ip–In is decreased, thereby effecting a reduction in the potential VN11 of the node N11.

In the foregoing embodiment, the data determining circuitry is for use in a sense amplifier which determines the level of the bit line of a semiconductor memory circuit system. However, the present invention is not limited to a semiconductor memory circuit system, and may find widespread application in all semiconductor circuit systems which use the current mode data transfer method.

As is seen from the foregoing description, the present invention offers the following advantages. Feedback control is performed on the potential of the data line in accordance with a change in the potential. Meanwhile, the data which has been previously read on the data line is temporarily latched, and based on the level of the latched data, the offset operation is performed on the data line. Particularly, even if data which is currently read is reversed (reversed data) with respect to previously read data, the offset operation is performed on the data line to accurately determine the currently read data, thereby achieving the high-speed data determining operation.

What is claimed is:

1. Data determining circuitry for determining a level of data by a current flowing in a data line of a semiconductor circuit system, said data line being connected to an output node of a source of the current flowing, said data determining circuitry comprising:
   a feedback control circuit for controlling a potential of said data line in accordance with a change in a potential of the output node;
   a data latch circuit for temporarily latching data previously read on said data line; and
   an offset circuit for performing an offset operation on said data line based on a level of the previously read data latched in said data latch circuit.

2. Data determining circuitry according to claim 1, further comprising:
   a current supply transistor connected to the output node; and
   a control transistor connected between said output node and said data line,
   wherein said feedback control circuit and said offset circuit control a potential of a control electrode of said control transistor based on the level of the previously read data latched in said data latch circuit.

3. Data determining circuitry according to claim 1, wherein said data line is connected to a memory cell.

4. A data determining method for determining a level of data by a current flowing in a data line of a semiconductor circuit system, said data line being connected to an output node of a source of the current flowing, said data determining method comprising the steps of:
   performing a feedback control on a potential of said data line in accordance with a change in a potential of the output node;
   temporarily latching data previously read on said data line; and
   performing an offset operation on said data line based on a level of the previously read data which is temporarily latched in said latching step.

5. A data determining method according to claim 4, wherein said data determining method is used in data determining circuitry which comprises a current supply transistor connected to the output node, and a control transistor connected between said output node and said data line, and wherein a potential of a control electrode of said control transistor is controlled based on the level of the previously read data which is temporarily latched in said latching step.

6. A data determining method according to claim 4, wherein said data line is connected to a memory cell.

* * * * *